United States Patent [19]

Smith

[11] Patent Number: 5,545,891
[45] Date of Patent: Aug. 13, 1996

[54] CIRCUIT FOR INCREASING THE SENSITIVITY OF A PHOTODIODE TO RECEIVED INFRARED SIGNALS IN RESPONSE TO CHANGES IN AMBIENT LIGHT

[76] Inventor: Marcus R. Smith, 496 Cullen Dr., Pacifica, Calif. 94044

[21] Appl. No.: 431,454

[22] Filed: May 1, 1995

Related U.S. Application Data

[63] Continuation-in-part of Ser. No. 48,908, Apr. 20, 1993, abandoned.

[51] Int. Cl.[6] .............................. H04B 10/00; H01J 40/14
[52] U.S. Cl. .................................. 250/214 AL; 359/142; 359/146; 359/189
[58] Field of Search .................................... 359/142, 146, 359/161, 189, 193, 194, 172; 250/214 A, 214 AL

[56] References Cited

U.S. PATENT DOCUMENTS

| | | | |
|---|---|---|---|
| 4,222,880 | 9/1980 | Baur et al. | 359/142 |
| 4,394,691 | 7/1983 | Amano et al. | 358/194.1 |
| 4,485,301 | 11/1984 | Gontowski et al. | 250/214 A |
| 4,663,521 | 5/1987 | Maile | 250/214 AL |
| 4,718,112 | 1/1988 | Shinoda | 359/148 |
| 4,807,052 | 2/1989 | Amano | 358/194.1 |
| 4,817,203 | 3/1989 | Tsurumoto et al. | 359/146 |
| 4,885,803 | 12/1989 | Hermann et al. | 359/148 |
| 4,905,279 | 2/1990 | Nishio | 380/9 |
| 4,939,482 | 7/1990 | Nergaard et al. | 359/142 |
| 4,989,081 | 1/1991 | Miyagawa et al. | 359/142 |
| 5,081,534 | 1/1992 | Geiger et al. | 358/194.1 |
| 5,109,222 | 4/1992 | Welty | 359/148 |
| 5,142,397 | 8/1992 | Dockery | 359/145 |
| 5,204,768 | 4/1993 | Tsakiris et al. | 359/148 |
| 5,255,180 | 10/1993 | Shinoda et al. | 340/825.69 |

FOREIGN PATENT DOCUMENTS 0129595  5/1989  Japan ..................................... 359/146

Primary Examiner—Leo Boudreau
Assistant Examiner—Rafael Bacares
Attorney, Agent, or Firm—Thomas M. Freiburger

[57] ABSTRACT

A system for operating electronic audio equipment and other components located inside a closed cabinet receives an infrared signal from a hand held remote control device anywhere in the room, and transmits the signal directly to the signal receiver of each component inside the cabinet. An infrared receiver eye of the system is positioned where it is optically exposed to the infrared signals within the room, such as in an exposed bore of the cabinet adjacent to the gap between doors of the cabinet. The signal received at the receiver eye is repeated by a main transceiver and delivered to individual emitters at the electronic components such as VCR or stereo audio components. In a preferred embodiment the transceiver has a repeater which receives the infrared signal and repeats it in an electrical signal sent through wires to infrared emitters dedicated to each component, where the same infrared signal received by the transceiver is repeated at the components. A circuit is disclosed for enhancing the sensitivity of the receiving photodiode at the cabinet.

2 Claims, 5 Drawing Sheets

CIRCUIT FOR INCREASING THE SENSITIVITY OF A PHOTODIODE TO RECEIVED INFRARED SIGNALS IN RESPONSE TO CHANGES IN AMBIENT LIGHT

REFERENCE TO RELATED APPLICATION

This application is a continuation-in-part of application Ser. No. 08/048,908, filed Apr. 20, 1993, now abandoned.

BACKGROUND OF THE INVENTION

The invention is concerned with remote control of audio components, video tape recorders and other such electronic components. In particular, the invention relates to enhancements of the operation of the remote features of such components by enabling them to be controlled when contained in a closed cabinet.

Televisions, video tape players, compact disc players and other stereo equipment are widely available as remotely controllable components. These electronic appliances or components generally are contained in a cabinet in the owner's home. In the case of a television, the doors normally must be open when the television is being used, so that no problem is presented regarding the ability of the television's remote sensor to receive the signal from the hand held remote control unit. However, in the case of stereo components and VCRs, it is generally desirable aesthetically to have the cabinet doors closed during the use of these components; it is an inconvenience to have to leave the cabinet doors open to avoid optical blocking of the infrared remote signal by the cabinet.

A related problem to which the invention is addressed is the ability to use infrared remote control devices over relatively long distances or in non-direct line of sight environments such as between adjacent rooms in a building. IR remote control systems installed as features in production electronic equipment do not have enough sensitivity to operate in such extended range requirements.

In the past, one solution to this problem has been to send control signals over an electrical wire from one room to another, converting signals from IR to electrical and back to IR. Another approach has been to convert the IR to RF and back to IR, thus enhancing distance. A third approach has been to increase the power output of the IR at the remote control device.

The above solutions have many other factors involved that reduce their system transparency in operation. The wire up-down conversion requires an IR receiver within close proximity to the user, thus restricting the user's movement only to locations which relay the signal to its destination.

The radio up-down conversion method has the above limiting factor, i.e. the user must be near an IR detector, if, for example, the IR receiver/radio transmitter is plugged into a wall. If the IR to radio conversion is battery-powered and attaches to the remote control, there is an inability to readily use multiple remote controls, the battery requires periodic replacement, and the combination is aesthetically unpleasant. These devices also have an antenna and a power cord on the RF receiving end, usually designed to sit across from the equipment to be controlled, again being very unsightly.

The power increase module is also a battery operated device that mounts onto the front of the remote control, and therefore carries with it the same problems as noted above for the radio transmitter, i.e. batteries, single remote use, and aesthetically unpleasant.

As one can see by looking at each of these previous approaches, although the distance enhancement and room-to-room service can be increased, the user adds some negative features to his system as well.

The following U.S. patents describe various aspects of remote control devices, typically using an infrared signal to control televisions, stereo components and other electronic appliances: Dockery U.S. Pat. No. 5,142,397, Geiger U.S. Pat. No. 5,081,534, Nishio U.S. Pat. No. 4,905,279, Hermann U.S. Pat. No. 4,885,803, Amano U.S. Pat. No. 4,807,052, Amano U.S. Pat. No. 4,394,691, Baur U.S. Pat. No. 4,222,880.

The Geiger patent describes a system which receives signals in a television and distributes instructions to a VCR as based on inputs by the user as to what he selects. The TV creates the instructions for the VCR. In other words, the television acts as a receiver, in a sense as a repeater, but it also serves as a receiver and encoder/decoder. On the other hand, the present invention, described below, involves simply a repeater that is not part of any appliance and which does not encode or decode. It simply repeats, and the environment in which it is used is different from Geiger's. The present device carries a signal inside a closed cabinet by use of the repeater.

The Dockery patent differs from the present invention in that it shows a range extender for infrared remote control devices, via RF transmission. The RF transmitter is positioned outside the cabinet and possibly in another room from the components. The receiver is apparently near the components but probably has to be outside the cabinet if more than one component is involved, since it would not be positioned to service all components.

The Baur patent has little relevance to this invention, disclosing fluorescing signals generated optically from infrared, for a different purpose.

Amano Patent No. 4,807,052 discloses a system primarily concerned with decoding data and separating functions for several remotely controlled devices.

The Hermann patent uses some components similar to those used in this invention, but has a different system arrangement and a different purpose. The goal of the Hermann system is to allow remote signals generated by persons in several different rooms with televisions, to be received in the room transmitted and then to be picked up in a box in the TV room and sent via wires to another location in the building, possibly outside, to a device which retransmits the same infrared signal to control a VCR, antenna position and/or satellite dish position. The Hermann patent does not involve a cabinet which would block the IR remote signal receivers contained on components, and the retransmitter device is not hidden inside a cabinet. The Hermann patent does not recognize the problem of a closed cabinet as blocking the receipt of infrared remote signals, even though the patent discloses use of some of the same infrared transmitter components as in the present invention. In other words, the Hermann patent is more concerned with distant components which are located possibly in another portion of the building or outside the building, and the extending of range to operate those components, which is done by wire. Thus, the patent is concerned with enabling the control of antenna position, satellite position, VCR setting, etc., from any of a plurality of rooms with television sets, i.e. accessing the antenna and other devices from different televisions.

The Nishio patent discloses a system which does not include any receiving eye separated for placement in a closed cabinet. The system is primarily concerned with differentiating between codes for operation of different devices, which might be identical to each other. The system enables a person to input a specific code to a receiver/ transmitter device, for instructing the device to operate the intended one of a plurality of similar appliances.

Amano Patent No. 4,394,691 discloses a remote control system which does not provide a single concealed infrared receiving eye, but discloses the use of multiple receiving eyes. The patent is primarily concerned with bussing decoded signals. The patent is not concerned with closed cabinets or the ability to receive signals when a cabinet blocks an appliance's infrared receiver.

SUMMARY OF THE INVENTION

In accordance with this invention, a method and system are provided for operating electronic audio or video appliances or components in a cabinet with a closed door or doors, where those doors would optically obstruct the components from receiving infrared remote control signals. The system involves a cabinet having at least one remotely controllable electronic component in the cabinet, each component including an infrared receiver for the remote control function. Infrared emitter means are included in the cabinet, one dedicated to each remotely controllable component and being positioned to emit an infrared signal to each component infrared receiver. Within the cabinet is a main transceiver with repeater means for transmitting an infrared signal which repeats an infrared signal received by the transceiver. The repeated signal is conducted by signal conducting means from the transceiver to each infrared emitter means positioned in the cabinet for the components. Included with the main transceiver is an infrared receiver eye positioned on the cabinet (inside or outside) so as to be optically accessible to receiving infrared signals transmitted from outside the cabinet with the doors of the cabinet closed. In this way, the components in the cabinet may be operated with the cabinet fully closed, by the transmitting of signals from hand held remote control devices toward the closed cabinet where the component infrared receivers are optically obstructed. This is effected by receiving the hand held remote signal with the exposed infrared receiver eye at the cabinet, the main transceiver then repeating and rerouting the remote control signal to the infrared emitter means positioned at each of the components. Only one of the components, of course, will be able to read the infrared remote signal—the one component which is matched to the hand held remote being used by the operator.

In a preferred embodiment, the infrared emitter means are dedicated infrared emitters, each being secured directly adjacent to the respective component infrared receiver on the electronic component, oriented to direct the signal against the infrared receiver. In this embodiment the emitters are fed by electric wires which transmit the desired signal electrically from the main transceiver.

In one preferred embodiment the infrared receiver eye is positioned inside the cabinet so as to be optically accessible through a gap between the cabinet doors or between a door and the cabinet wall. In other embodiments the receiver eye may be in a recessed bore of the cabinet or even near the bottom of the cabinet within a kick space of a cabinet having such a space.

An alternative embodiment of the invention involves the use of optical fibers extending from the main transceiver to each infrared emitter means, in this case the emitter means comprising the distal ends of the optical fibers, positioned directly adjacent to the respective component infrared receivers.

One aspect of the invention is that it preferably extends the useful range of infrared remote control devices by being a more sensitive receiver. This is not accomplished by placing an infrared photodiode sensor closer to the user's hand held remote position and then running wires or RF signals back to the controlled appliances, as suggested in some of the prior art. In other words, the system of the invention simply boosts the signal received by the main receiver eye, enabling the hand held remote control devices to be operated at greater distances and with less need for line-of-sight aiming.

In another important aspect of the invention, distance enhancement of IR remote systems is achieved through increased sensitivity at the receiving end, at the location of the equipment.

By locating a very sensitive IR receiver at the equipment that has the capability to repeat to a plurality of devices, distance is enhanced to such a degree that it will operate in non-direct line-of-sight, i.e. bouncing off walls and furniture from adjacent rooms with the room doors open. The system can work with multiple remote controls with no unsightly attachments and has only the IR eye exposed. In one embodiment the IR eye can be hidden from sight because the eye is sensitive enough to be put in a "toe-kick" or upper fascia so that it "sees" the room but the user does not see the eye. This approach gives increased distance and system transparency, without the drawbacks of previous approaches.

All high quality IR receivers use some form of automatic gain control and a bias resistor pulling current through the photodiode, which limits the distance to a certain fixed value. In the new approach sensitivity is allowed to increase as ambient light/noise decreases. With gain fixed at a high value, the new circuit varies the current through the photodiode using a current mirror circuit to allow the photodiode itself greater sensitivity when it requires less current to counteract ambient light. This permits the optimum distance for IR receptivity in a given environment. Another way to express this concept is that the current mirror circuit keeps the eye's sensitivity just above the extremely low ambient/ noise levels in a given environment.

It is therefore among the objects of the present invention to improve the performance of remote hand held remote control devices for electronic components, both by increasing the range of the hand held remote controls by improving sensitivity to the IR signal, and by retransmitting and rerouting infrared signals received at the front of a cabinet having closed doors, to deliver the repeated signal directly at the infrared sensors of each the components contained in the cabinet. These and other objects, advantages and features of the invention will be apparent from the following description of a preferred embodiments, considered along with the accompanying drawings.

DESCRIPTION OF PREFERRED EMBODIMENTS

Figure 1:
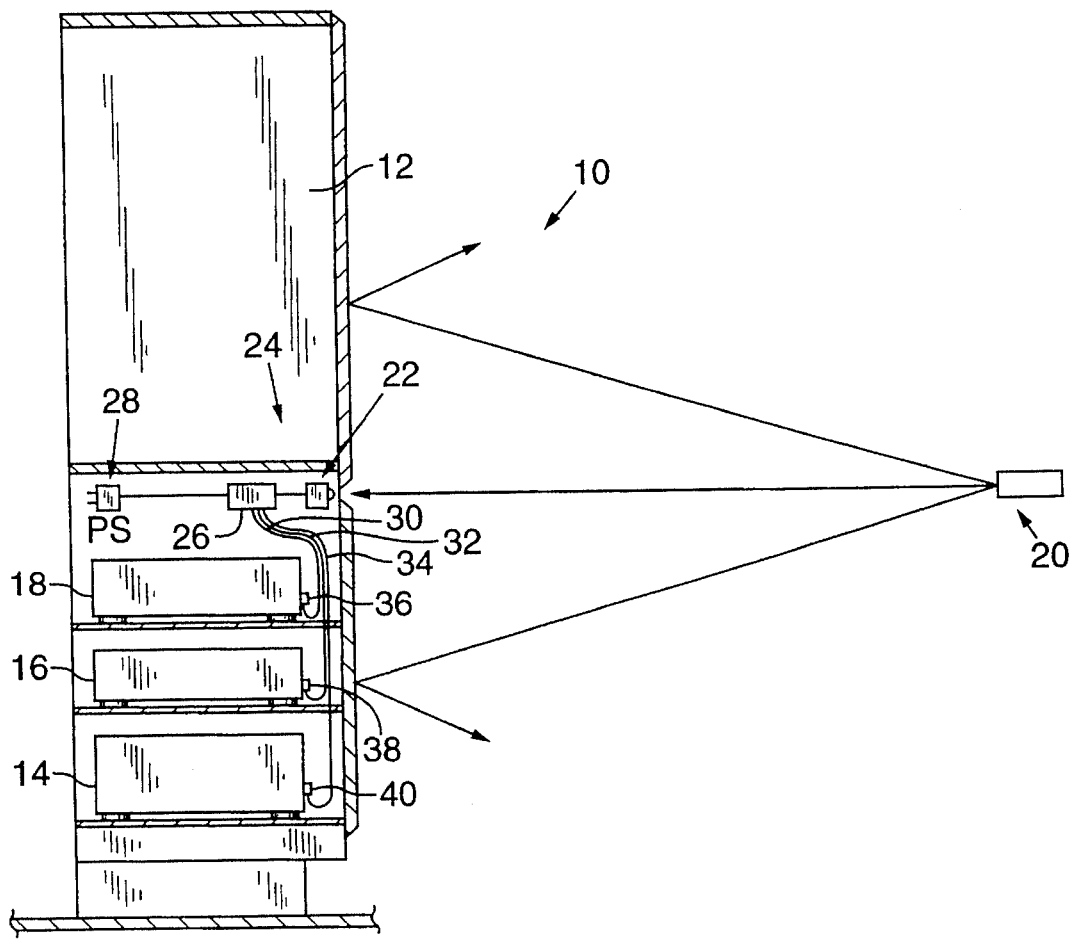
FIG. 1 is a somewhat schematic side elevation view, showing electronic components such as audio components contained inside a furniture cabinet with closed doors, and illustrating the principles of the invention.

FIG. 1 shows a system generally identified as 10 for delivering remote control signals to stereo, VCR and other electronic components contained within a closed cabinet 12. As indicated in FIG. 1, the components may include, for example, a radio receiver 14, a tape player 16 and a compact disc player 18, among other components. Each of the electronic components 14–18 is remotely controllable using a hand held remote control device which emits infrared radiation of prescribed characteristics to operate the particular component. In FIG. 1 a hand held infrared remote control device 20 is shown, at some distance in front of the component cabinet 12. The remote control device 20 is one which typically is purchased along with the remotely controlled component to which it is matched. The remote device 20 will operate only one of the components within the cabinet 12.

The system 10 includes a main infrared receiver eye 22, positioned to be optically accessible to receive an infrared signal transmitted from outside the cabinet, somewhere within the room within which the cabinet is located. As FIG. 1 shows, the IR remote 20 sends a signal which diverges with distance, generally in an expanding cone shape, and it is not necessary that the remote device 20 be positioned as directly in front of the cabinet as is illustrated in FIG. 1.

The receiver eye 22 is part of a main transceiver of the system, generally identified as 24, and also including a main housing 26 containing a circuit which will be described below. A power supply 28 is schematically indicated in FIG. 1 for powering the circuit and main transceiver 24, the power supply in a preferred embodiment drawing power from the standard wall current power supply, the same which powers the electronic components 14–18.

From the main transceiver 24, i.e. the housing 26, extend a series of signal conductors 30, 32 and 34 as seen in FIG. 1. Each of these terminates at an infrared emitter 36, 38, 40 as illustrated. Such an infrared emitter is dedicated to and affixed directly against each remotely controllable electronic component, at a position directly in front of the component infrared receiver of the particular component. More than three signal conductors/emitters can be included; six or more may be needed in some situations.

Thus, any of the hand held infrared remote devices for the particular components 14–18 (such as the remote device 20 shown) can be used to operate the respective electronic component without the need to open the cabinet doors, which otherwise optically block the components from the position where the remote device is operated.

Figure 1A:
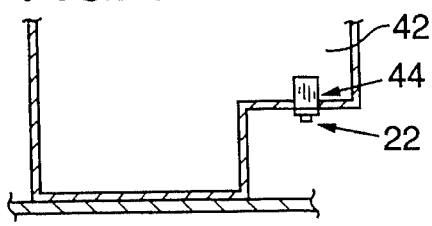
FIG. 1A is a side elevation view of a cabinet showing another location for a receiver of the system of the invention.

FIG. 1A shows an alternative position for the main infrared receiver eye 22, in this case in a bottom panel of a cabinet 42 having a toe space 44 at its bottom front. The main receiver eye 22 may be recessed into to the bottom panel of the cabinet, essentially aimed downwardly at the floor, with the receiving function depending on the reflection of infrared signals off the floor. As explained further below, the system 10 preferably includes a booster so that the useful range of hand held infrared remote devices is increased, as well as enhancing the effectiveness of reflected infrared signals.

Figure 1B:
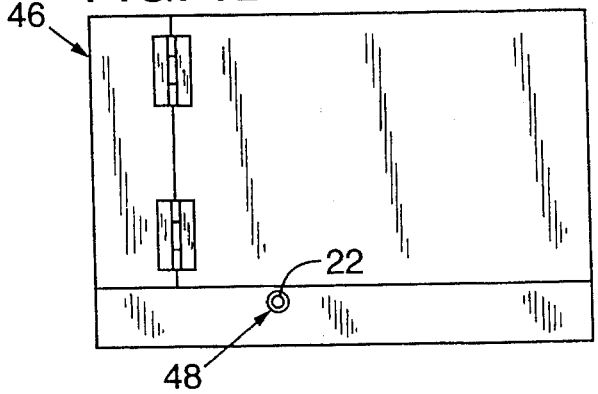
FIG. 1B is a front view of a cabinet, showing another location for the receiver.

FIG. 1B is a frontal view of a cabinet 46, showing another arrangement wherein a main infrared receiver eye 22 is secured within a bore or opening 48 of a front panel of the cabinet. The receiver eye 22 may be recessed within the hole 48 if desired, to shield the eye from extraneous signals or miscellaneous radiation, thus enhancing its effectiveness.

Figure 2:
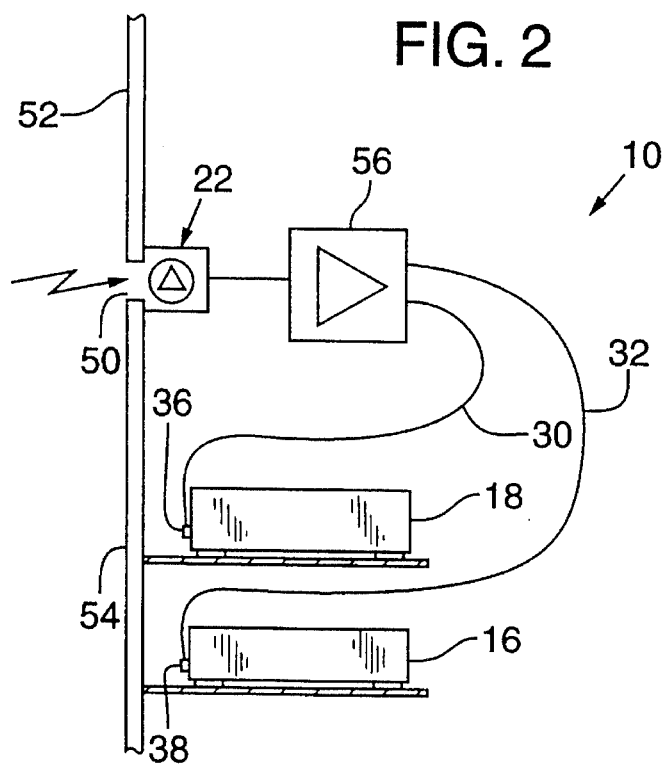
FIG. 2 is a detail view showing an example of positioning of various elements of the system of the invention, relative to a closed cabinet and several remotely controlled components.

FIG. 2 is an enlarged partial schematic view indicating positioning of components of the system 10 within a cabinet. FIG. 2 shows a slot or opening 50 between closed doors and/or fixed panels 52 and 54 on the cabinet. The slot or opening may be quite narrow, such as ⅛ inch. Infrared control signals enter through the slot or opening 50 and are received by the main infrared receiver eye 22, schematically indicated as a photovoltaic cell. The signal is amplified and retransmitted by a "repeater" 56, and sent through signal conductors 30 and 32 to respective components 18 and 16 (some of the components indicated in FIG. 1), as well as other remotely controllable components if present. Each signal goes to an infrared emitter means 36, 38 which is positioned to direct a retransmitted infrared signal directly into the component infrared receiver.

It should be understood that the signal may be amplified and retransmitted as an electrical (voltage) signal, to be delivered via infrared emitters 36, 38 which received the electrical signals and re-emit the same signal (amplified) which was received by the main infrared receiver 22; or fiber optics 30, 32 may be used to conduct the infrared signal to the emitter means 36, 38 which in that case comprise the terminal ends of the fiber optics. In that case the amplifier/repeater 56 simply amplifies the infrared signal, by converting it to an electrical signal and driving a high output infrared emitter to which the input ends of the optical fibers are placed, inside the repeater box 26.

Figure 3:
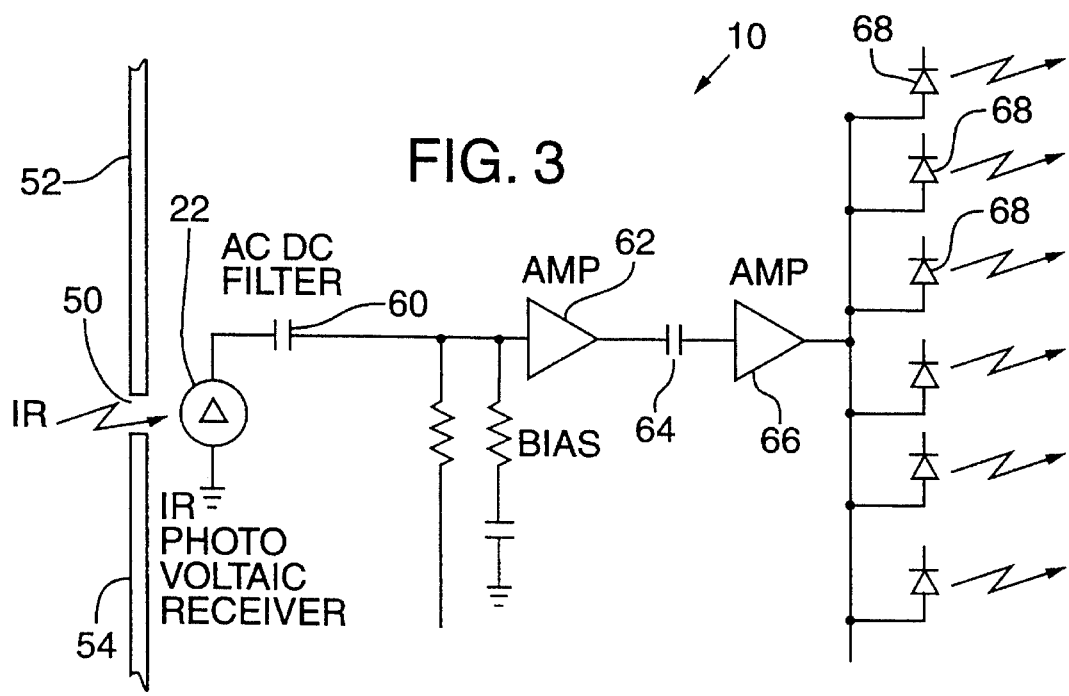
FIG. 3 is a simplified block diagram type conceptual circuit diagram illustrating the system of the invention.

FIG. 3 further illustrates the system 10 of the invention, in a simplified circuit diagram. Infrared signals are received through the slot or opening 50 in the cabinet by the main infrared receiver 22 of the system, a photovoltaic cell. The resulting voltage signal is passed through an AC/DC filter 60, through an amplifier 62, capacitor 64 and amplifier 66 as indicated, to be delivered to a series of infrared emitters indicated at 68, further described in the circuit diagram of FIG. 4.

Figure 4:
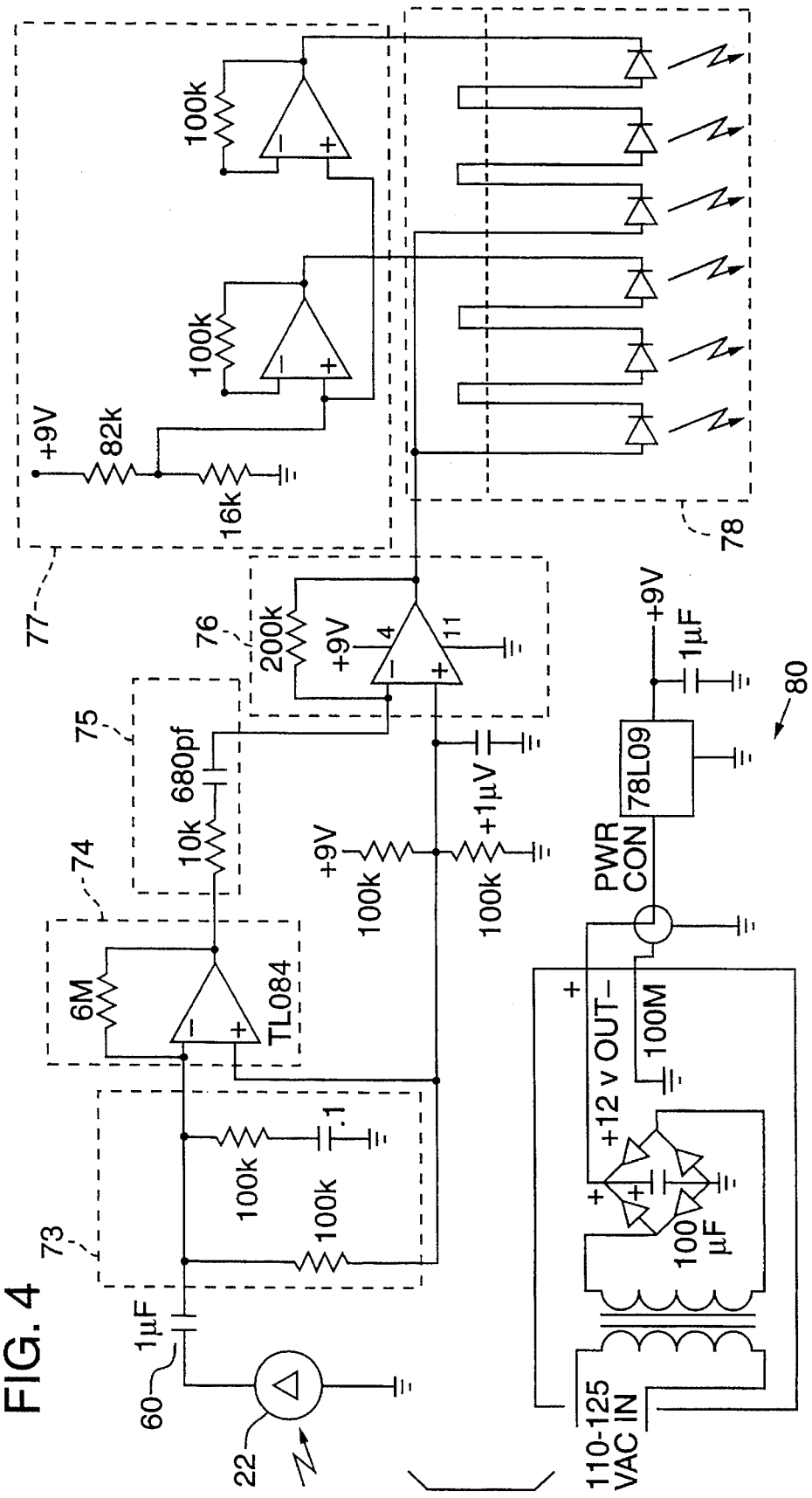
FIG. 4 is a circuit diagram showing the system of the invention.

FIG. 4 is a more detailed circuit diagram of the intra-cabinet repeater system of the invention. In FIG. 4 groups of components are shown within dashed lines, each given a reference character for purposes of this discussion.

At 22 is shown the photovoltaic cell as the main infrared receiver eye, optically filtered for IR signal reception and positioned so as to be optically unblocked. This component preferably is connected by about six inches of coaxial wire to a main circuit board comprising most of the rest of FIG. 4 and located in a radio frequency shielded box, i.e. the housing 26 indicated in FIG. 1. As indicated, the anode of the photodiode is to ground, with the cathode connected to a one microfarad capacitor shown at 60, for electronically filtering out constant ambient light signals. The one microfarad capacitor 60 is connected to biasing components 73, for offset input filtering, and also to the inverting input of a first gain stage operational amplifier indicated at 74, including one fourth of one TL084, and a 6 megohm resistor as indicated. The output of the first gain stage op amp is connected to a 10,000 ohm resistor in series with a 680 picofarad capacitor, as indicated at 75 in the drawing, to electronically filter out the effects of florescent light frequencies and other low frequency light signals. The filter 75 is connected to the inverting side of a second gain stage amplifier indicated at 76, including one fourth of a TL084, and a 200,000 ohm resistor as indicated. The second gain stage provides a DC offset and sufficient output current for peak detection and drive of the output signal emitters, indicated at 78 and located outside the RF shielding box on individual pairs of wires.

As shown in the schematic diagram, the second gain stage is connected to the anode side of two sets of three emitters connected in series, in this preferred embodiment. The cathode sides of the IR emitters at 78 are connected to two separate peak detection offset bias op amps indicated at 77, to keep the IR emitters at a threshold bias. The offset is determined by the 82,000 ohm and 16,000 ohm resistors included in the group 77. These values may vary with the use of different emitters, or different numbers of emitters. Peak detected signals are produced as reproductions of the original IR signals sent to the receiving eye at 22.

The power supply is voltage regulated with a conventional voltage regulator, including a 78L09 and a one microfarad capacitor as indicated, preceded by a wall-mounted transformer rectifier/filter capacitor module, all of which are shown in the group of components 80.

Figure 5:
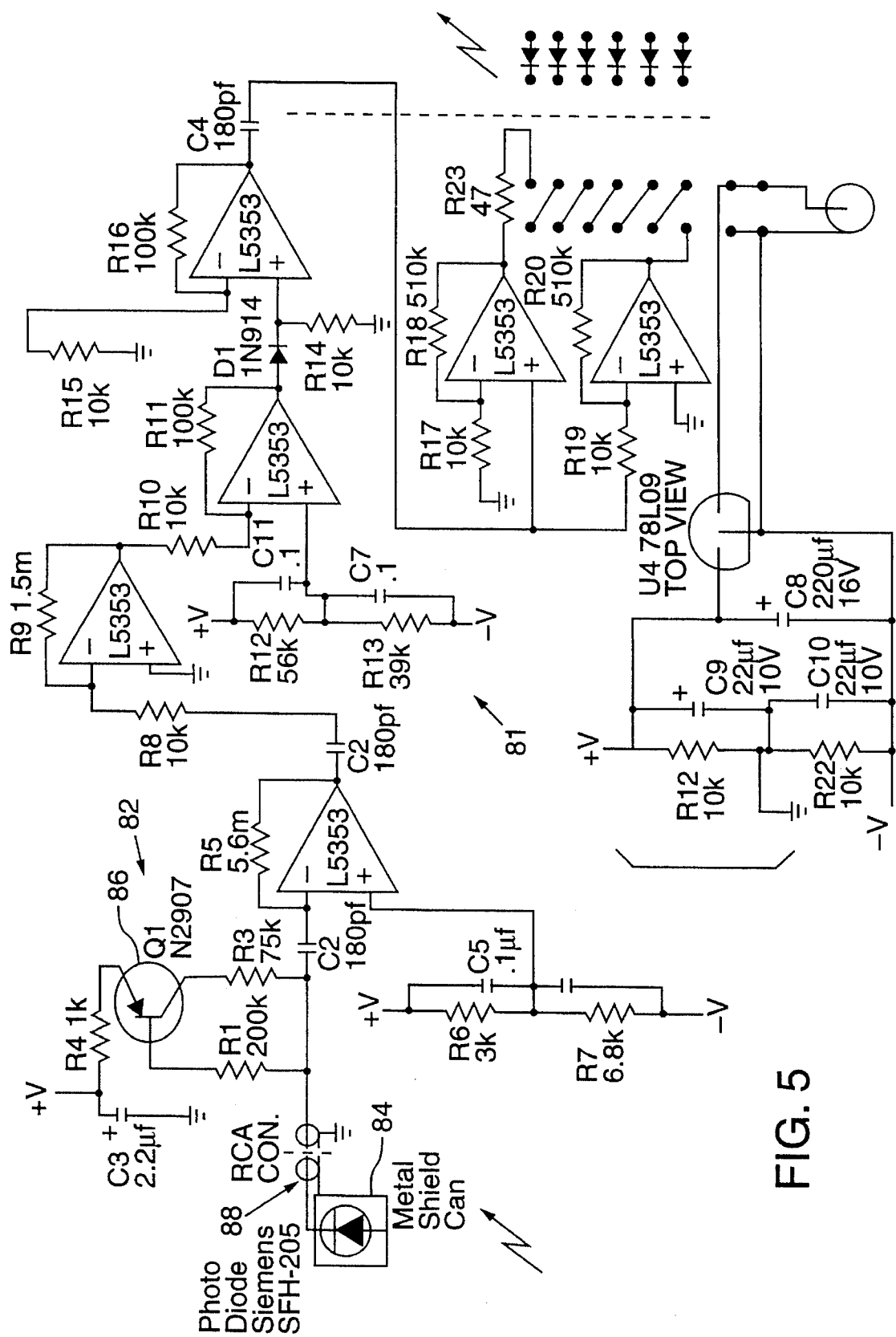
FIG. 5 is an alternative circuit diagram for the system of the invention, including a subcircuit for enhancing the sensitivity at the receiving end of an IR remote system.
Figure 6:
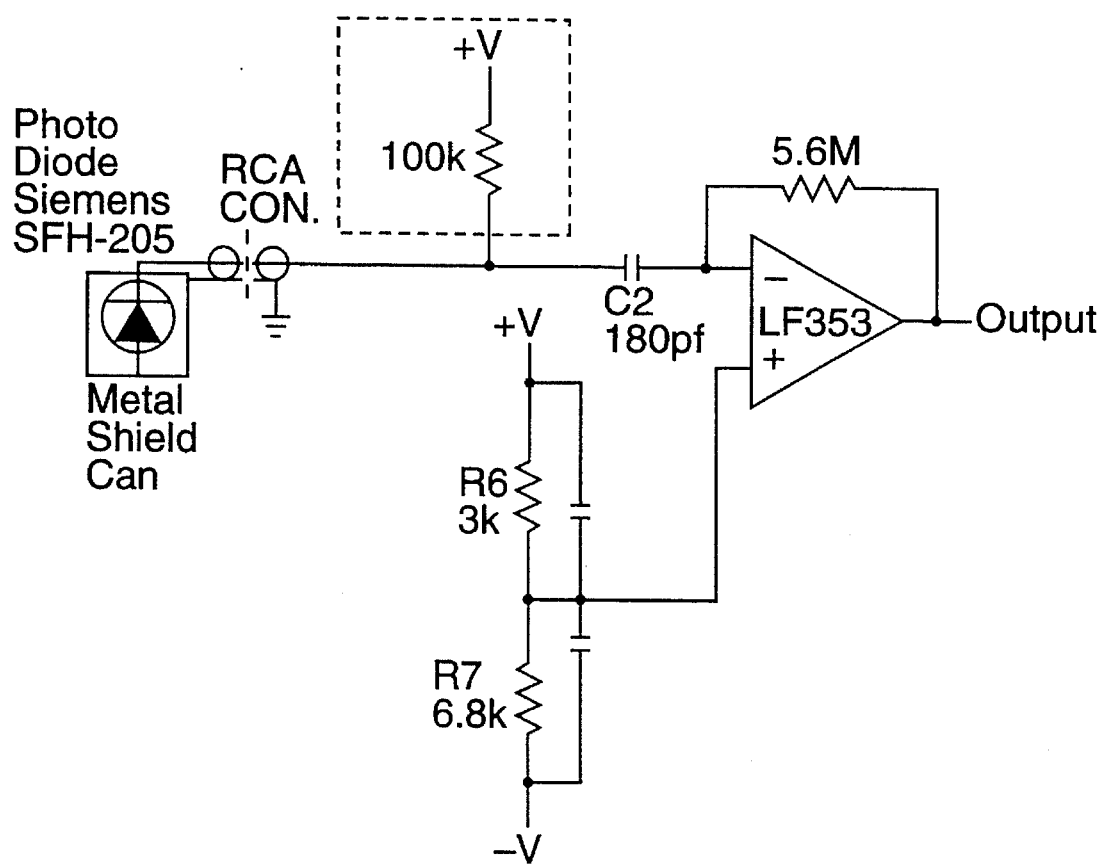
FIG. 6 is a circuit diagram showing generally a typical prior art circuit which the sensitivity enhancing subcircuit in the diagram of FIG. 5 can replace.

FIG. 5 is another circuit diagram showing a circuit 81 which has some advantageous differences from the circuit of FIG. 4. In particular, the circuit enhances sensitivity to IR signals by minimizing photodiode biasing current to the minimum required for ambient light conditions. At the left side of the diagram is a current mirror subcircuit 82 which enhances the sensitivity of the circuit for receiving IR signals, such as from different rooms within the same building or from relatively large distances. The current mirror subcircuit 82 is in place of a static pull-up resistor such as shown in FIG. 6, typical of prior art circuits of this general type. The prior art pull-up resistor deliberately biases the photodiode so strongly, at a fixed bias current level, that it will cancel out the effects of even very strong light. This causes a reduction in the overall sensitivity of the circuit to IR signals. With the resistor delivering a fixed bias current the photodiode never reaches its optimum sensitivity (in less than maximum ambient light).

The current mirror subcircuit 82 includes a photodiode 84 and a transistor 86. Together these vary the amount of bias current through the photodiode, automatically adjusting for noise and ambient light. This optimizes the AC reception sensitivity of the photodiode 84. Resistors R1 (200K) and R3 (75K) shown in the drawing act as a current interface between the transistor 86 and the photodiode 84. 180 picofarad capacitor C1 acts as a standard DC decoupling input device for primary amplifier stage of the typical infrared photoreceiver. Shielding of the photodiode and/or input to the circuit board is shown at 88.

It is therefore seen that as the ambient light increases or decreases, the transistor 86 and the photodiode 84 act against each other, or in coordination with each other, in a current mirror relationship. The current mirror relationship accordingly increases or decreases the bias current through the photodiode as ambient light increases or decreases, keeping the photodiode's sensitivity for AC signals just above ambient light. The effect is to greatly increase the diode's sensitivity to infrared signals, by keeping the photodiode at its minimum necessary bias current, which is the optimum bias current according to the ambient light.

The remainder of the circuit shown in FIG. 5 comprises a signal amplifying circuit for repeating or rebroadcasting the input IR signal and serves essentially the same function as the circuitry shown in FIG. 4, but is somewhat more efficient.

The above described preferred embodiments are intended to illustrate the principles of the invention but without limiting its scope. Other embodiments and variations to these preferred embodiments will be apparent to those skilled in the art and may be made without departing from the essence and scope of the invention as defined in the claims.

I claim:

1. A circuit for increasing the sensitivity of a photodiode to received infrared signals, comprising:

a transistor and a photodiode positioned in the circuit to act with each other in a current mirror relationship in which changes in ambient light at the photodiode cause the transistor to change accordingly the level of bias current through the photodiode, thereby increasing the photodiode's sensitivity to said infrared signals by keeping the photodiode at its minimum necessary bias current.

2. The circuit of claim 1, in combination with at least one component of electronic audio or video equipment operable by infrared remote control, each component having a component infrared receiver including said photodiode, and including a hand-held remote control device capable of emitting infrared control signals to control the component when the infrared remote control signals are received by said photodiode.

* * * * *